United States Patent
Chou et al.

(10) Patent No.: US 8,755,185 B2
(45) Date of Patent: Jun. 17, 2014

(54) SEMICONDUCTOR MODULE

(75) Inventors: Chung-chih Chou, Numazu (JP); Takeshi Fukami, Susono (JP); Yuji Oda, Susono (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 126 days.

(21) Appl. No.: 13/515,663

(22) PCT Filed: Jan. 8, 2010

(86) PCT No.: PCT/JP2010/050130
§ 371 (c)(1),
(2), (4) Date: Jun. 13, 2012

(87) PCT Pub. No.: WO2011/083578
PCT Pub. Date: Jul. 14, 2011

(65) Prior Publication Data
US 2012/0250253 A1  Oct. 4, 2012

(51) Int. Cl.
*H05K 7/20* (2006.01)
(52) U.S. Cl.
USPC .......................................... 361/699; 165/80.4
(58) Field of Classification Search
None
See application file for complete search history.

(56) References Cited

U.S. PATENT DOCUMENTS

| | | | |
|---|---|---|---|
| 6,166,937 A * | 12/2000 | Yamamura et al. | 363/141 |
| 6,414,867 B2 * | 7/2002 | Suzuki et al. | 363/141 |
| 7,710,721 B2 * | 5/2010 | Matsuo et al. | 361/699 |
| 2009/0140595 A1 | 6/2009 | Naganawa et al. | |
| 2009/0302444 A1 | 12/2009 | Ueda et al. | |
| 2010/0188814 A1 * | 7/2010 | Nakatsu et al. | 361/689 |
| 2011/0069455 A1 | 3/2011 | Tokuyama et al. | |
| 2011/0249421 A1 * | 10/2011 | Matsuo et al. | 361/821 |

FOREIGN PATENT DOCUMENTS

| | | |
|---|---|---|
| CN | 101281904 A | 10/2008 |
| CN | 101599484 A | 12/2009 |
| JP | 01-278058 A | 11/1989 |
| JP | 2004-158489 A | 6/2004 |
| JP | 2005-311046 A | 11/2005 |
| JP | 2009-159815 A | 7/2009 |
| JP | 2009-176871 A | 8/2009 |
| JP | 2009-295794 A | 12/2009 |

OTHER PUBLICATIONS

International Search Report mailed Apr. 13, 2010 of PCT/JP2010/050130.
Translation of International Preliminary Report on Patentability (PRP) mailed Aug. 16, 2012 of PCT/JP2010/050130.

\* cited by examiner

*Primary Examiner* — Gregory Thompson
(74) *Attorney, Agent, or Firm* — Kenyon & Kenyon LLP

(57) ABSTRACT

A semiconductor module includes an upper arm and a lower arm of an inverter circuit. The upper arm has a switching element and a rectifying device and the lower arm has a switching element and a rectifying device. The upper arm and the lower arm are laminated such that the switching elements overlap each other and the rectifying devices overlap each other. Refrigerant flow paths constituting cooling sections respectively extend along both sides in the lamination direction of the switching elements and the rectifying devices and are folded back at the rectifying device lamination section side.

2 Claims, 10 Drawing Sheets

SEMICONDUCTOR MODULE

This is a 371 national phase application of PCT/JP2010/050130 filed 8 Jan. 2010, the contents of which are incorporated herein by reference.

TECHNICAL FIELD

The present invention relates to a semiconductor module, and in particular, to a semiconductor module which is used in vehicles such as an electric car or a hybrid car.

BACKGROUND ART

In the past, as a semiconductor module which is used in vehicles, for example, a semiconductor module such as that described in Japanese Unexamined Patent Application Publication No. 2009-159815, in which a series circuit provided with an upper arm and a lower arm is built-in and a semiconductor element and a diode in the same arm overlap each other, has been known. Then, the semiconductor module is cooled by providing cooling metals on both sides of the module and providing a cooling channel which is folded back at the diode side.

CITATION LIST

Patent Literature

[Patent Literature 1] Japanese Unexamined Patent Application Publication No. 2009-159815

SUMMARY OF INVENTION

Technical Problem

However, in the conventional semiconductor module described above, the following problems arise. That is, since the diode and the semiconductor element have different areas, in a case where members having different areas overlap each other, a contact area with the cooling metal (a radiation member) is reduced in the surface of that having a smaller area (mainly, the surface on the diode side), so that heat radiation is not sufficiently performed. Further, a state, such as during motor locking, where only a specific switching element produces heat is not taken into account, and thus the above-described cooling structure is not sufficient.

The present invention has been made in order to solve such a technical problem and an object of the invention is to provide a semiconductor module in which improvement in heat radiation efficiency can be attained.

Solution to Problem

According to an aspect of the invention, there is provided a semiconductor module comprising: an upper arm and a lower arm, each of the arms having a switching element and a rectifying device, wherein the upper arm and the lower arm are laminated such that the switching elements of the upper arm and the lower arm overlap each other and the rectifying devices of the upper arm and the lower arm overlap each other.

In the semiconductor module according to the above aspect of the invention, since the upper arm and the lower arm are laminated to face each other such that the switching elements of the upper and lower arms overlap each other and the rectifying devices overlap each other, the switching elements of the upper and lower arms form a laminated structure and the rectifying devices of the upper and lower arms form a laminated structure. For this reason, the contact areas with radiation members are equal at the upper and lower surfaces, so it is possible to diffuse heat evenly. As a result, heat radiation efficiency can be improved.

According to another aspect of the invention, there is provided a semiconductor module provided with an upper arm and a lower arm, each of the arms having a switching element and a rectifying device, the module comprising: a switching element lamination section in which the switching elements of the upper arm and the lower arm overlap each other; a rectifying device lamination section in which the rectifying devices of the upper arm and the lower arm overlap each other; and cooling sections provided at least on both sides in the lamination direction of the switching elements and the lamination direction of the rectifying devices and that cool the switching element lamination section and the rectifying device lamination section.

In the semiconductor module according to the above aspect of the invention, since the switching element lamination section in which the switching elements of the upper and lower arms overlap each other and the rectifying device lamination section in which the rectifying devices of the upper and lower arms overlap each other are provided, the contact areas with the radiation members become equal to each other at the upper and lower surfaces. In this way, it becomes possible to diffuse heat evenly, so that heat radiation efficiency can be improved. Further, since the cooling sections are provided at least on both sides in the lamination direction of the switching elements and the lamination direction of the rectifying devices, the arm on the side where heat generation does not occur can be used as a radiation area making use of the fact that the upper and lower arms do not produce heat at the same time during motor locking. Therefore, cooling performance during motor locking can be improved and the heat radiation efficiency of the entire module can be improved.

In the semiconductor module according to the above aspect of the invention, the cooling sections may have a refrigerant and a refrigerant flow path for circulating the refrigerant, and the refrigerant flow paths may be respectively provided along both sides in the lamination direction of the switching elements and the lamination direction of the rectifying devices and folded back at the rectifying device lamination section side. In this case, since the upper and lower arms are laminated to each other and the refrigerant flow paths are folded back, a reduction in the size of the entire module can be attained. Further, by folding back the refrigerant flow paths to the rectifying device lamination section side where heat generation does not occur, since the temperature of the refrigerant in the switching element lamination section is kept low, it is possible to improve the cooling function.

Advantageous Effects of Invention

According to the invention, a semiconductor module can be provided in which improvement in heat radiation efficiency can be attained.

DESCRIPTION OF EMBODIMENTS

Figure 1:
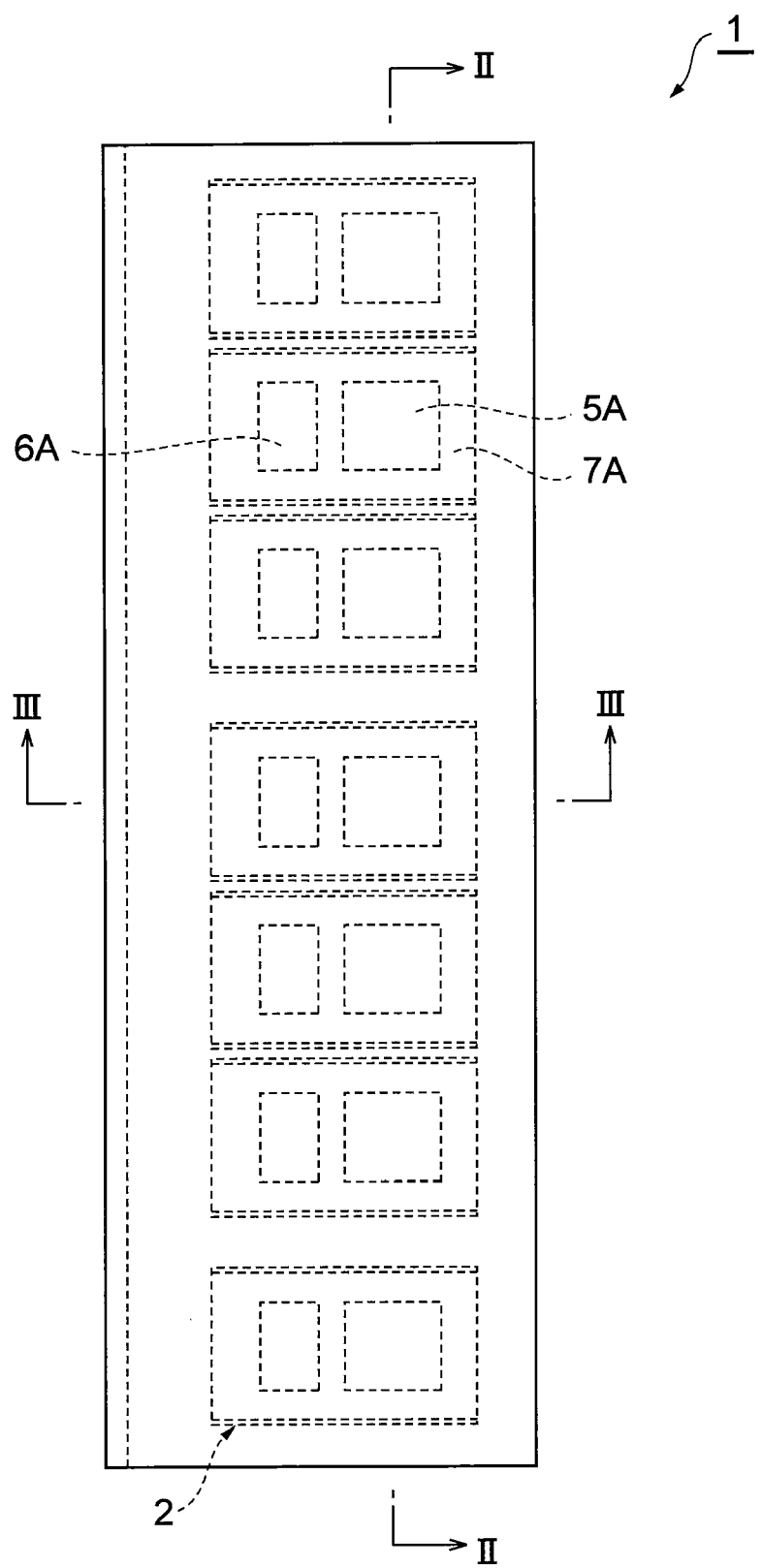
FIG. 1 is a plan view showing a semiconductor module related to an embodiment.

Hereinafter, an embodiment of the invention will be described in detail with reference to the accompanying drawings. In addition, in the description of the drawings, the same element is denoted by the same reference numeral and an overlapping description is omitted.

Figure 2:
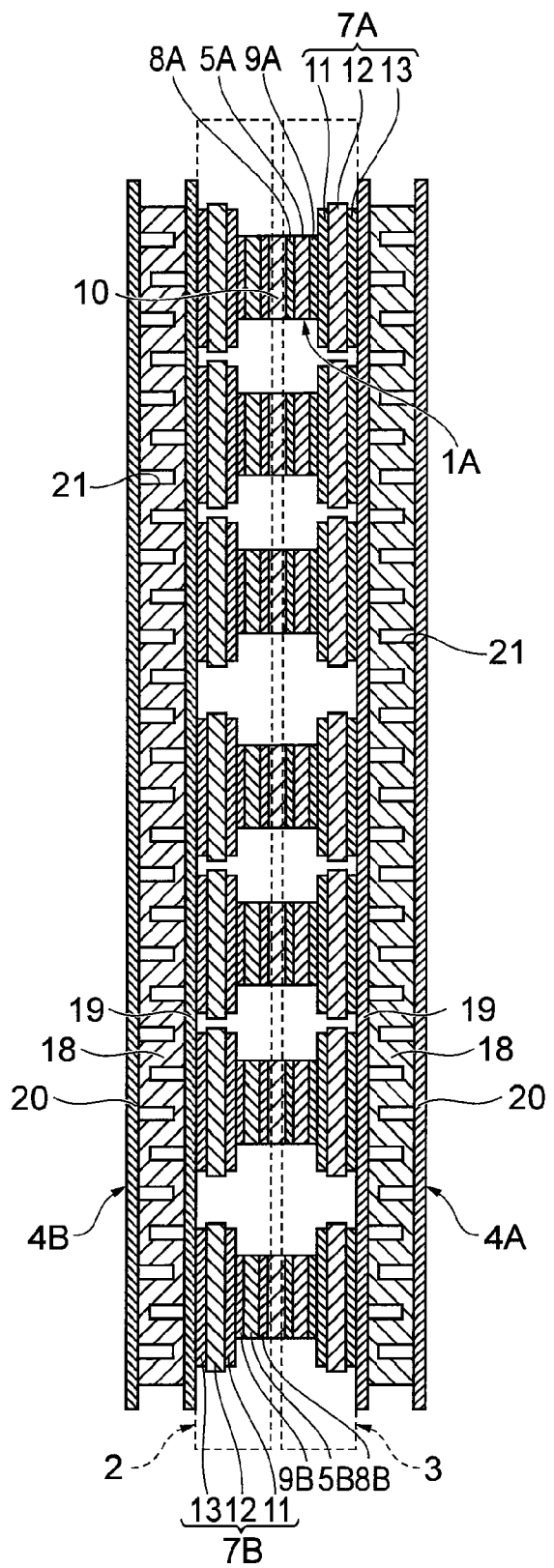
FIG. 2 is a cross-sectional view along line II-II of FIG. 1.
Figure 3:
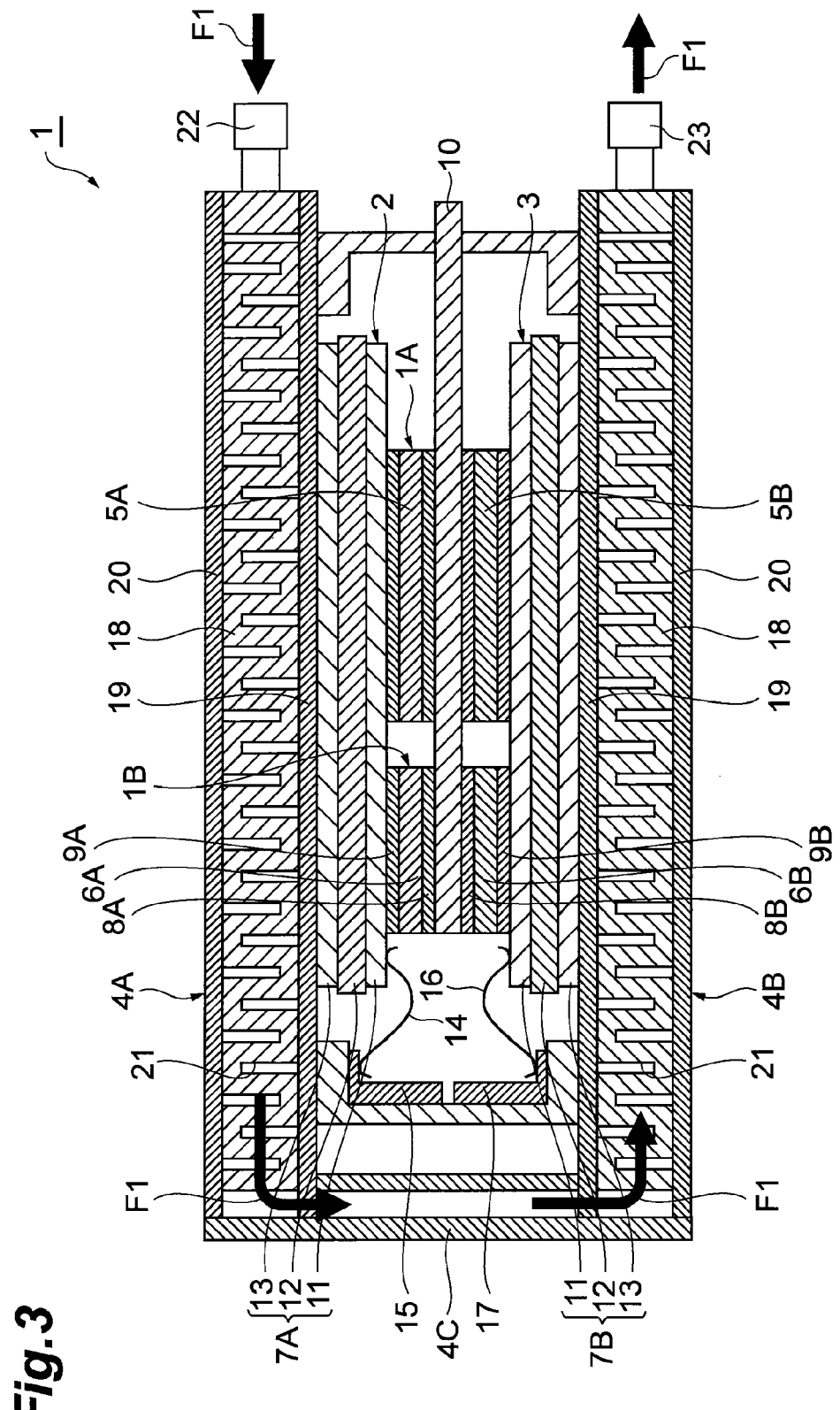
FIG. 3 is a cross-sectional view along line III-III of FIG. 1.

FIG. 1 is a plan view showing a semiconductor module related to an embodiment, FIG. 2 is a cross-sectional view along line II-II of FIG. 1, and FIG. 3 is a cross-sectional view along line III-III of FIG. 1. A semiconductor module 1 related to this embodiment includes an upper arm 2 and a lower arm 3 of an inverter circuit. The upper arm 2 and the lower arm 3 have the same structure and are laminated to be symmetrically displaced vertically with respect to a bus bar 10 disposed therebetween. Then, coolers 4A and 4B are provided on both sides of the laminated body of the upper arm 2 and the lower arm 3.

The upper arm 2 includes a plurality of switching elements 5A, rectifying devices 6A, and insulating substrates 7A, on which the switching elements 5A and the rectifying devices 6A are mounted. As shown in FIG. 2, an emitter which is located on the surface side of the switching element 5A is electrically connected to the bus bar 10 through a solder layer 8A. A collector which is located on the back side of the switching element 5A is fixed to the insulating substrate 7A by a solder layer 9A. Further, as shown in FIG. 3, an anode which is located on the surface side of the rectifying device (for example, a diode) 6A is electrically connected to the bus bar 10 through the solder layer 8A. A cathode which is located on the back side of the rectifying device 6A is fixed to the insulating substrate 7A by the solder layer 9A.

The insulating substrate 7A is a DBA (Direct Brazed Aluminum) substrate and has a structure in which an upper metal layer 11 made of aluminum or aluminum alloy, an insulating layer 12 made of aluminum nitride, and a lower metal layer 13 made of aluminum or aluminum alloy are laminated. The upper metal layer 11 is electrically connected to the switching element 5A and the rectifying device 6A through the solder layer 9A. The lower metal layer 13 is joined to the cooler 4A by brazing. Further, the upper metal layer 11 is electrically connected to a bus bar 15 through a bonding wire 14.

The lower arm 3 includes a plurality of switching elements 5B, rectifying devices 6B, and insulating substrates 7B, on which the switching elements 5B and the rectifying devices 6B are mounted. As shown in FIG. 2, an emitter which is located on the surface side of the switching element 5B is electrically connected to the bus bar 10 through a solder layer 8B. A collector which is located on the back side of the switching element 5B is fixed to the insulating substrate 7B by a solder layer 9B.

Further, as shown in FIG. 3, an anode which is located on the surface side of the rectifying device (for example, a diode) 6B is electrically connected to the bus bar 10 through the solder layer 8B. A cathode which is located on the back side of the rectifying device 6B is fixed to the insulating substrate 7B by the solder layer 9B. The insulating substrate 7B has the same structure as the insulating substrate 7A. An upper metal layer 11 of the insulating substrate 7B is electrically connected to a bus bar 17 through a bonding wire 16. The lower arm 3 is joined to the cooler 4B by brazing.

By laminating the upper arm 2 and the lower arm 3, a switching element lamination section 1A in which the switching elements 5A and 5B overlap each other and a rectifying device lamination section 1B in which the rectifying devices 6A and 6B overlap each other are respectively formed.

The coolers 4A and 4B are respectively provided on both sides in the lamination direction of the upper arm 2 and the lower arm 3 and cool the switching element lamination section 1A and the rectifying device lamination section 1B. Each of the coolers 4A and 4B has a cooling fin 18 formed in a wavelike fashion, and a top plate 19 and a bottom plate 20 which fix the cooling fin 18 with it interposed therebetween.

The top plate 19 is disposed on the side adjacent to the upper arm 2 or the lower arm 3 and fixed to the lower metal layer 13 of each of the insulating substrates 7A and 7B by brazing. On the other hand, the bottom plate 20 is disposed on the outer side of the module to face the top plate 19. The cooling fin 18, the top plate 19, and the bottom plate 20 are formed of a material such as aluminum or steel having high thermal conductivity. A hollow portion partitioned by the cooling fin 18 in the inside of each of the coolers 4A and 4B forms a refrigerant flow path 21 for circulating a refrigerant.

As shown in FIG. 3, a connecting section 4C which extends along the lamination direction of the upper arm 2 and the lower arm 3 and connects the cooler 4A and the cooler 4B to each other is provided on the rectifying device lamination section 1B side. By providing the connecting section 4C in this manner, the refrigerant flow path 21 is folded back at the rectifying device lamination section 1B side. Then, the refrigerant is introduced from an inlet 22 along the direction of arrow F1, goes through the refrigerant flow path 21 in the cooler 4A, is folded back at the rectifying device lamination section 1B side, flows through the refrigerant flow path 21 in the cooler 4B, and is discharged to the outside by way of an outlet 23. In this way, the refrigerant absorbs the generated heat from the switching element lamination section 1A and the rectifying device lamination section 1B, thereby efficiently cooling the switching element lamination section 1A and the rectifying device lamination section 1B.

Figure 4:
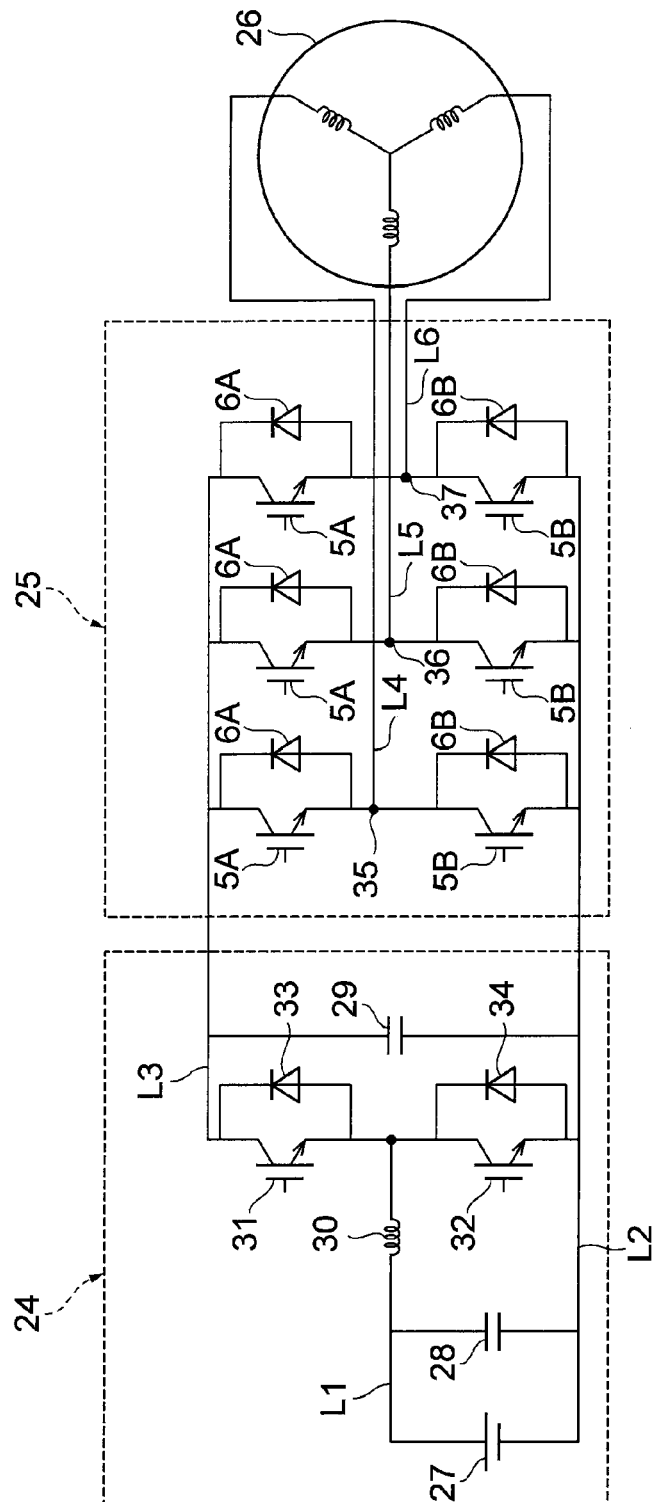
FIG. 4 is a circuit diagram showing the configuration of a power control unit using the semiconductor module.

FIG. 4 is a circuit diagram showing the configuration of a power control unit using the semiconductor module. The power control unit is mounted on, for example, a hybrid car and includes a pressurization converter 24, an inverter 25, and a motor generator 26. The pressurization converter 24 is a direct-current voltage converter that performs electric charge and electric discharge of a storage battery 27, and has capacitors 28 and 29, a reactor 30, transistors (switching elements) 31 and 32, and diodes (rectifying devices) 33 and 34.

The capacitor 28 is connected in parallel with the storage battery 27 between a power-supply line L1 and a ground line L2 and smoothes the charge and discharge voltage of the storage battery 27. The reactor 30 is connected, at one end thereof, to the power-supply line L1 and, at the other end, to a connection point of the transistors 31 and 32. The transistors 31 and 32 are connected in series between a power-supply line L3 and the ground line L2. Then, each of the diodes 33 and 34 is connected between the collector and the emitter of each of the transistors 31 and 32 so as to pass an electric current from the emitter side to the collector side.

Each of the transistors 31 and 32 is constituted by, for example, an insulated gate bipolar transistor (IGBT). The capacitor 29 is connected between the power-supply line L3 and the ground line L2 and functions as a power buffer.

The inverter 25 performs power conversion between the pressurization converter 24 and the motor generator 26. That is, the inverter 25 can convert direct-current power that is supplied from the storage battery 27 into three-phase alternating-current power having a three-phase voltage (U-phase voltage, V-phase voltage, and W-phase voltage) and also convert three-phase alternating-current power that is supplied from the motor generator 26 into direct-current power.

The inverter 25 has a U-phase arm 35, a V-phase arm 36, and a W-phase arm 37. The U-phase arm 35, the V-phase arm 36, and the W-phase arm 37 are connected in parallel between the power-supply line L3 and the ground line L2. Each of the U-phase arm 35, the V-phase arm 36, and the W-phase arm 37 is provided with the switching elements 5A and 5B connected in series to each other and the rectifying devices (the diodes) 6A and 6B respectively connected in parallel with the switching elements 5A and 5B.

Then, each of the U-phase arm 35, the V-phase arm 36, and the W-phase arm 37 is connected to a coil end on the opposite side to a neutral point of each phase coil of the motor generator 26 through each of output lines L4, L5, and L6. The motor generator 26 is constituted by, for example, a three-phase alternating-current synchronous electric motor-generator and generates a driving force by the three-phase alternating-current voltage from the inverter 25. Further, the motor generator 26 generates three-phase alternating-current voltage with use of the output of an engine and outputs the generated three-phase alternating-current voltage to the inverter 25.

Figure 5:
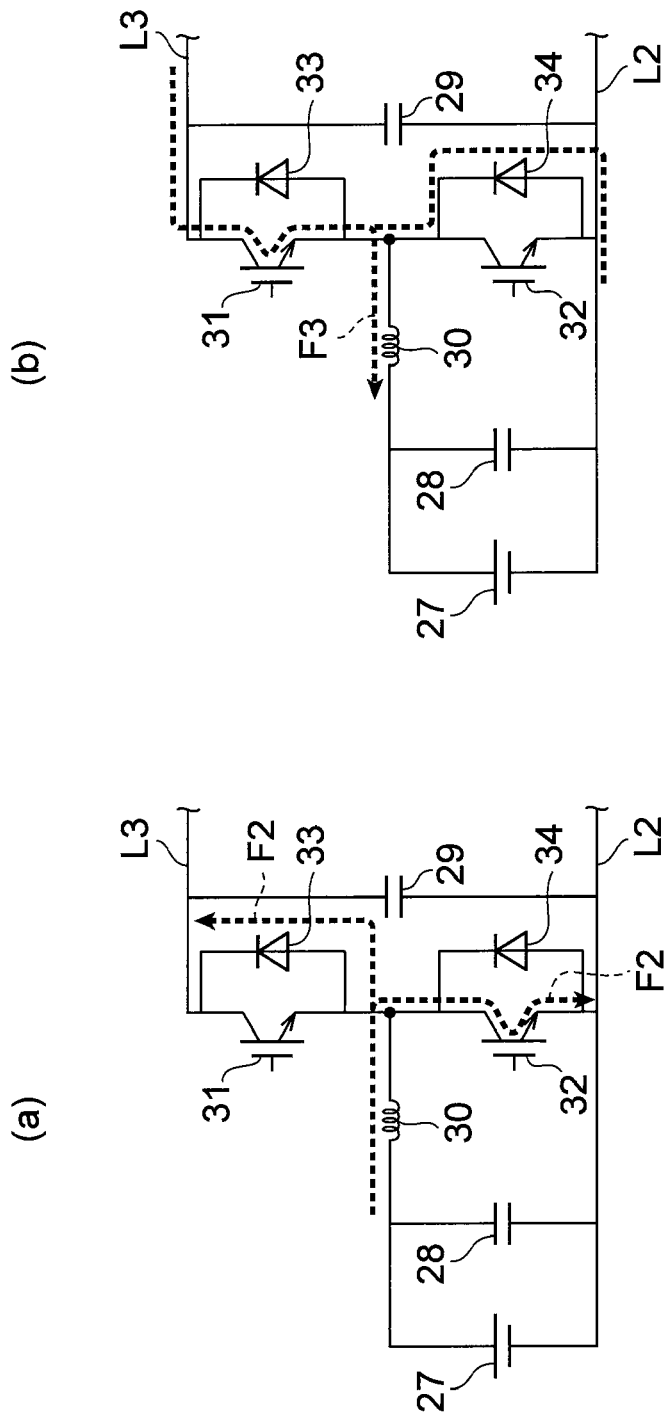
FIG. 5A is a circuit diagram showing a current flow of a pressurization converter during powering and FIG. 5B is a circuit diagram showing a current flow of the pressurization converter during regeneration.

FIG. 5A is a circuit diagram showing current flow of the pressurization converter during powering and FIG. 5B is a circuit diagram showing current flow of the pressurization converter during regeneration. As shown in FIG. 5A, an electric current which is supplied from the storage battery 27 during the powering goes through the reactor 30 and flows through each of the transistor 32 and the diode 33 (refer to an arrow F2). On the other hand, as shown in FIG. 5B, during regeneration, a three-phase alternating electric current goes through the transistor 31 and the diode 34 and flows through the reactor 30 (refer to an arrow F3).

Figure 6:
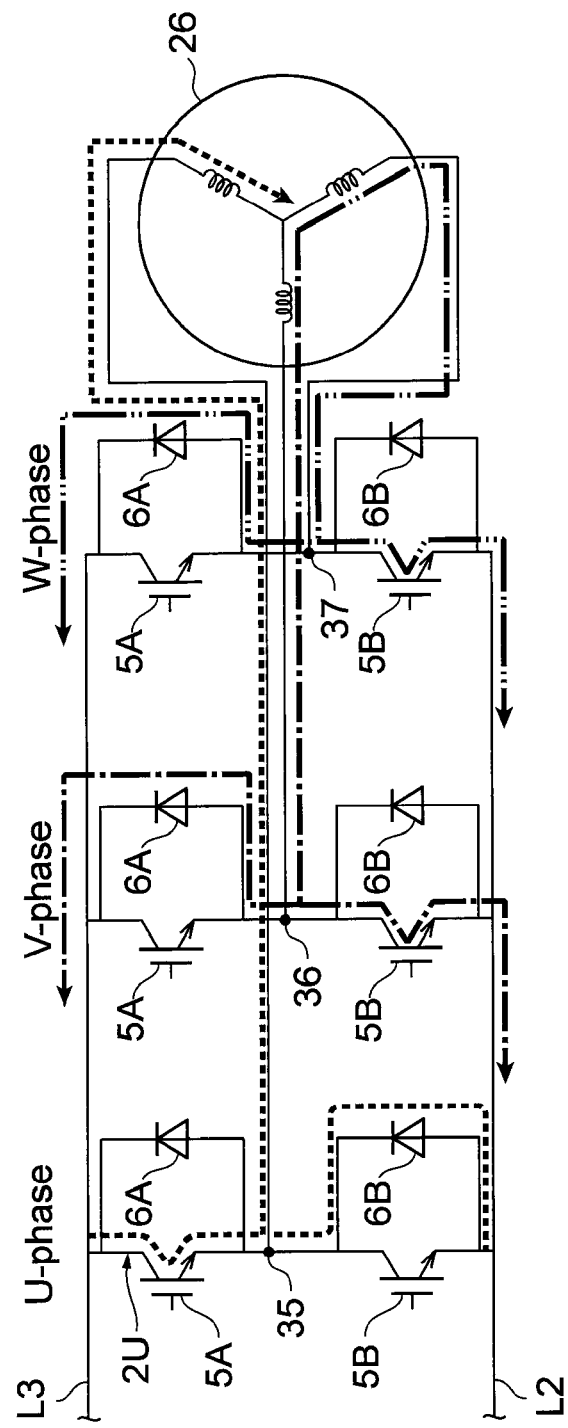
FIG. 6 is a circuit diagram showing a flow of an electric current during motor locking.

FIG. 6 is a circuit diagram showing the flow of an electric current during motor locking. In FIG. 6, in a case where a U-phase upper arm 2U has the maximum current (that is, in the case where locking which becomes inverter heat rate-limiting), flow of a U-phase current is shown by a broken line, flow of a V-phase current is shown by a dashed-dotted line, and flow of a W-phase current is shown by a dashed-two dotted line.

From FIGS. 5A, 5B, and 6, it is obvious that the switching elements 5A and 5B of the upper and lower arms 2 and 3 do not flow an electric current at the same time and the rectifying devices 6A and 6B do not flow an electric current at the same time. That is, in this case, the switching elements 5A and 5B do not produce heat at the same time and the rectifying devices 6A and 6B do not produce heat at the same time. Therefore, by laminating the switching elements 5A and 5B of the upper and lower arms 2 and 3 to each other and laminating the rectifying devices 6A and 6B to each other, it is possible to release heat from the arm through which an electric current does not flow (which does not produce heat). In this manner, by increasing the routes through which heat escapes by adopting a structure in which the switching elements 5A and 5B which do not produce heat at the same time are laminated to each other and the rectifying devices 6A and 6B which do not produce heat at the same time are laminated to each other, an improvement in heat radiation efficiency can be attained and the cooling function can be improved.

In the semiconductor module 1 configured as described above, since the switching elements 5A and 5B of the upper and lower arms 2 and 3 overlap each other and the rectifying devices 6A and 6B overlap each other, contact areas with the coolers 4A and 4B are uniform at the upper and lower surfaces. In this way, it is possible to diffuse heat evenly, so that heat radiation efficiency can be improved. In addition, by laminating the upper arm 2 and the lower arm 3, a reduction in the size of the semiconductor module 1 is attained easily.

Further, since the coolers 4A and 4B are provided on both sides in the lamination direction of the switching elements 5A and 5B and the lamination direction of the rectifying devices 6A and 6B, with use of the fact that during motor locking, the switching elements 5A and 5B do not produce heat at the same time and the rectifying devices 6A and 6B do not produce heat at the same time, the arm on the side where heat generation does not occur can be used as a radiation area. Therefore, even in a situation where only a specific switching element of the switching elements 5A and 5B or only a specific rectifying device of the rectifying devices 6A and 6B produces heat, as in during motor locking, cooling capacity can be sufficiently secured. As a result, the heat radiation efficiency of the entire semiconductor module 1 can be improved.

In addition, since the refrigerant flow paths 21 are folded back at the rectifying device lamination section 1B side, a reduction in the size of the entire module is easily attained. Further, since the amount of heat generation in the rectifying devices 6A and 6B is relatively lower than that in the switching elements 5A and 5B, by folding the refrigerant flow paths 21 back at the rectifying device lamination section 1B side, it is possible to secure a pressure loss in which there is a need to cool the switching elements 5A and 5B. In addition, since in the switching element lamination section 1A, the temperature of the refrigerant is kept low, cooling performance which cools the switching elements 5A and 5B can be improved.

Figure 7:
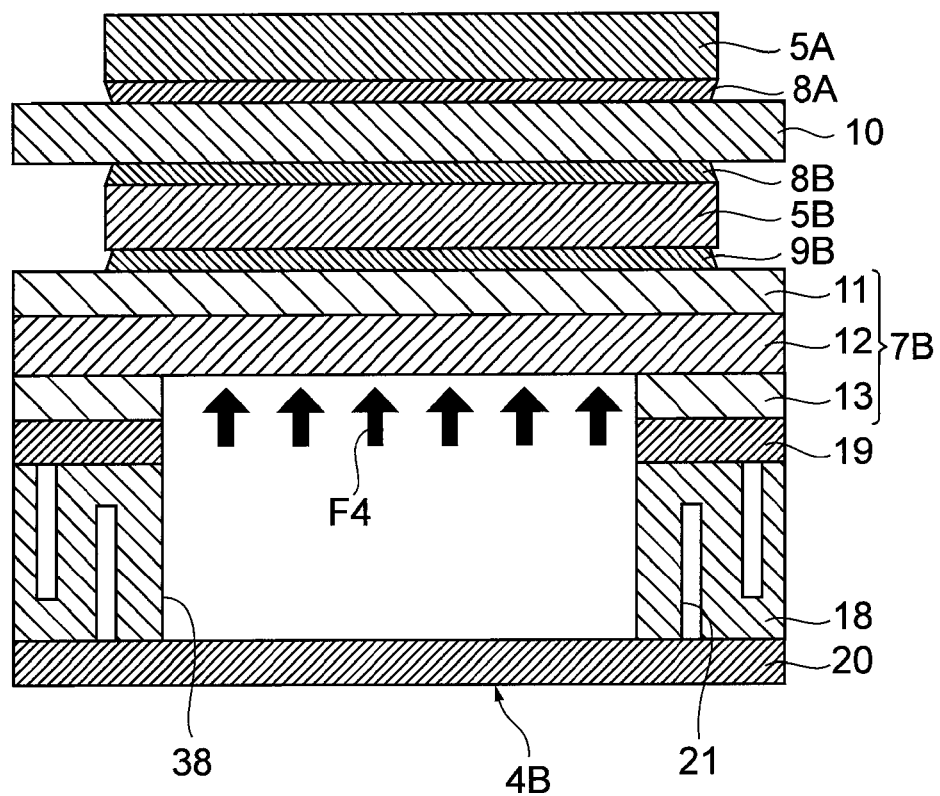
FIG. 7 is a partial cross-sectional view showing a modified example of the semiconductor module.

Hereinafter, modified examples of the semiconductor module will be described with reference to FIGS. 7 and 8.

In the modified example shown in FIG. 7, a space 38 that is a portion of the refrigerant flow path 21 is formed in the inside of each of the coolers 4A and 4B and at a position directly below each of the switching elements 5A and 5B. The space 38 extends between the bottom plate 20 and the insulating layer 12 of each of the insulating substrate 7A and 7B. In this way, since the refrigerant can directly cool the insulating layer 12, as shown by arrow F4, the refrigerant more efficiently absorbs heat, so that it is possible to improve cooling performance. Further, by providing the space 38 in this manner, an effect as a stress relieving material such as the role of a punching metal can also be expected, and stress can be relieved.

Figure 8:
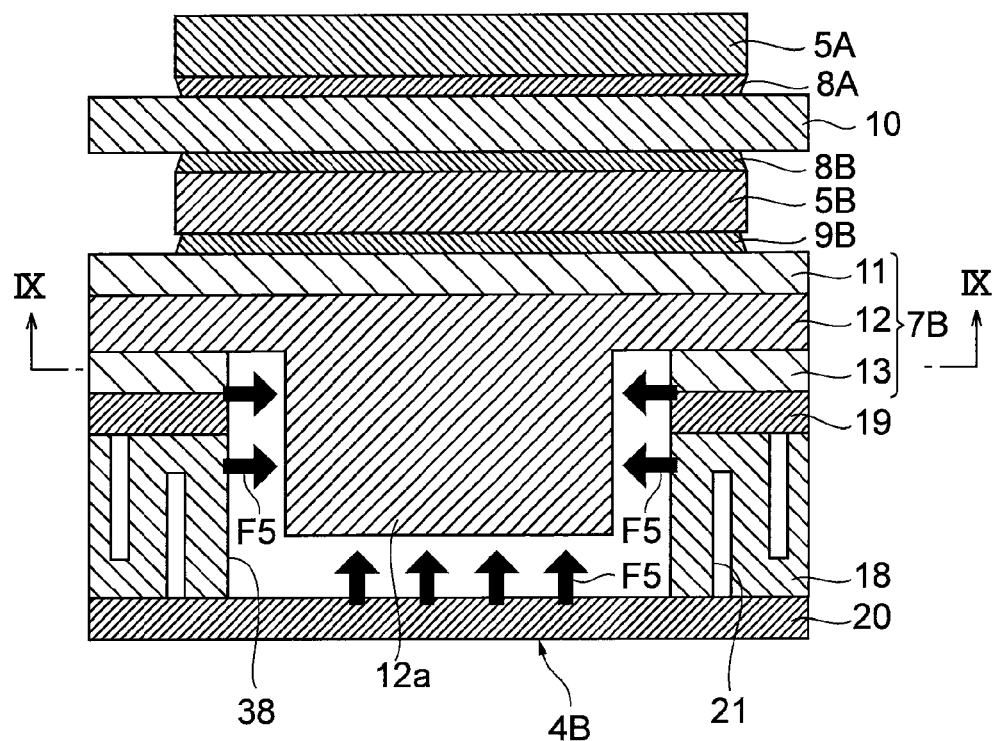
FIG. 8 is a partial cross-sectional view showing a modified example of the semiconductor module.
Figure 9:
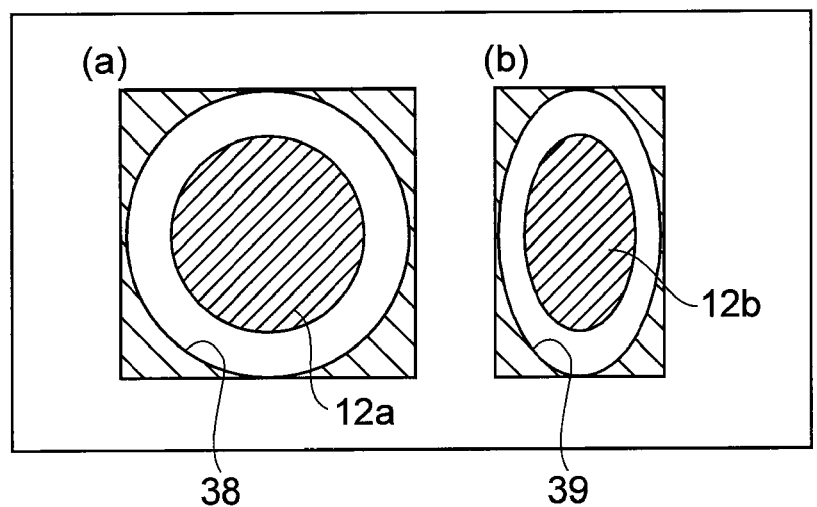
FIG. 9 is a schematic cross-sectional view along line IX-IX of FIG. 8.

In the modified example shown in FIG. 8, a projection portion 12a which projects into the space 38 is provided at the insulating layer 12 of each of the insulating substrates 7A and 7B. The projection portion 12a is formed into the form of a fin in order to more greatly increase the contact area with the refrigerant. FIG. 9 is a schematic cross-sectional view along line IX-IX of FIG. 8. In FIG. 9, (a) shows the space 38 which is formed at a position directly below each of the switching elements 5A and 5B, and (b) shows a space 39 which is formed at a position directly below each of the rectifying devices 6A and 6B.

As shown in (a) of FIG. 9, the space 38 formed at a position directly below each of the switching elements 5A and 5B is formed with a circular cross-section and the projection portion 12a of the insulating layer 12 is formed in a cylindrical shape. On the other hand, the space 39 formed at a position directly below each of the rectifying devices 6A and 6B is formed with an elliptical cross-section and a projection portion 12b is formed in an elliptic columnar shape (refer to (b) of FIG. 9).

As shown in FIG. 8, in this case, the refrigerant comes into direct contact with the insulating layer 12 not only from below, but also from the periphery of the projection portion 12a, as shown by arrow F5, thereby being able to cool the projection portion 12a. In this way, the effect of absorbing heat can be further increased, so that cooling performance can be improved.

Figure 10:
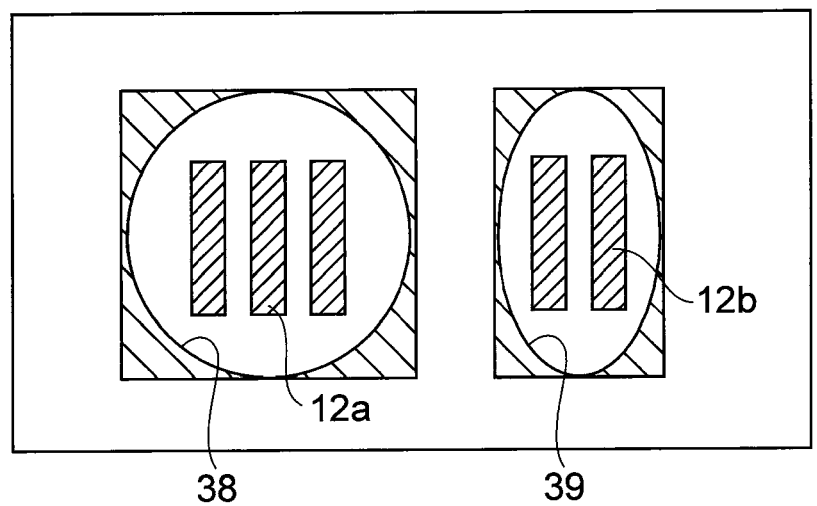
FIGS. 10A and 10B are schematic cross-sectional views showing modified examples of a projection portion.
Figure 10:
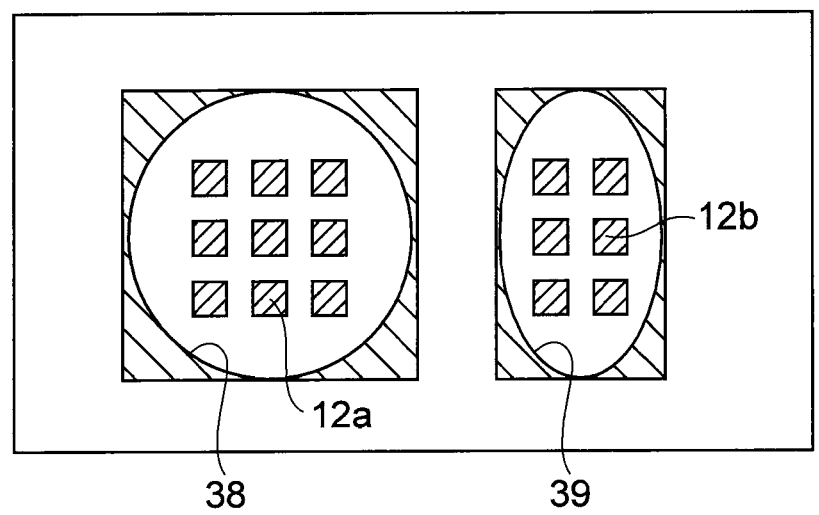

In addition, the shape, disposition, or the like of the projection portion is not limited to the contents described above. For example, as shown in FIG. 10A, each of the projection portions 12a and 12b may also be formed as a flat plate and provided in a plurality and in parallel according to the space of each of the spaces 38 and 39, otherwise, as shown in FIG. 10B, each of the projection portions 12a and 12b may also be formed in the form of a bar and arranged according to the space of each of the spaces 38 and 39. In this case, the contact area of the refrigerant with the projection portions 12a and 12b can be even further increased, so that the effect in which heat is absorbed can be further increased.

The above-described embodiment shows one example of the semiconductor module according to the invention. The semiconductor module according to the invention is not limited to that described in the above-described embodiment. The semiconductor module according to the invention may also include a modification of the semiconductor module related to the embodiment made so as not to change the gist stated in each claim, or may also be applied to others.

Reference Signs List

1: semiconductor module
1A: switching element lamination section
1B: rectifying device lamination section
2: upper arm
3: lower arm
4A, 4B: cooler
5A, 5B: switching element
6A, 6B: rectifying device
21: refrigerant flow path

The invention claimed is:

1. A semiconductor module provided with an upper arm and a lower arm, each of the arms having a switching element and a rectifying device, the module comprising:
    a switching element lamination section in which the switching elements of the upper arm and the lower arm overlap each other;
    a rectifying device lamination section in which the rectifying devices of the upper arm and the lower arm overlap each other; and
    cooling sections provided at least on both sides in the lamination direction of the switching elements and the lamination direction of the rectifying devices and that cool the switching element lamination section and the rectifying device lamination section,
    wherein each of the cooling sections has a refrigerant and a refrigerant flow path for circulating the refrigerant, and
    the refrigerant flow paths are respectively provided on both sides in the lamination direction of the switching elements and the lamination direction of the rectifying devices and folded back at the rectifying device lamination section side.

2. The semiconductor module according to claim 1, wherein a space that is a portion of the refrigerant flow path is formed within each of the cooling sections and at a position directly below the switching element or the rectifying device.

* * * * *